United States Patent

[11] 3,622,903

[72] Inventor Steven Alan Steckler
Clark, N.J.
[21] Appl. No. 888,391
[22] Filed Dec. 29, 1969
[45] Patented Nov. 23, 1971
[73] Assignee RCA Corporation

[54] HIGH-GAIN DIFFERENTIAL AMPLIFIER
15 Claims, 2 Drawing Figs.

[52] U.S. Cl. .......... 330/30, 330/18, 330/69
[51] Int. Cl. .......... H03f 3/68
[50] Field of Search .......... 330/18, 28, 30, 30 D, 69

[56] References Cited
UNITED STATES PATENTS

| | | | |
|---|---|---|---|
| 3,434,069 | 3/1969 | Jones | 330/30 D |
| 3,473,137 | 10/1969 | Stern | 330/30 |

*Primary Examiner*—Roy Lake
*Assistant Examiner*—Lawrence J. Dahl
*Attorney*—Eugene M. Whitacre

ABSTRACT: A high-gain, linear, differential amplifier which provides output voltage variations substantially equal to the total supply voltage associated with the amplifier. Each half of the amplifier comprises an input transistor, a shunt regulator transistor and a feedback arrangement between input and regulator transistors to maintain substantially constant current in the input transistor. Output transistors having their inputs in parallel with the regulator transistor inputs and output loads coupled in their collector-emitter current paths are provided.

Figure 1:
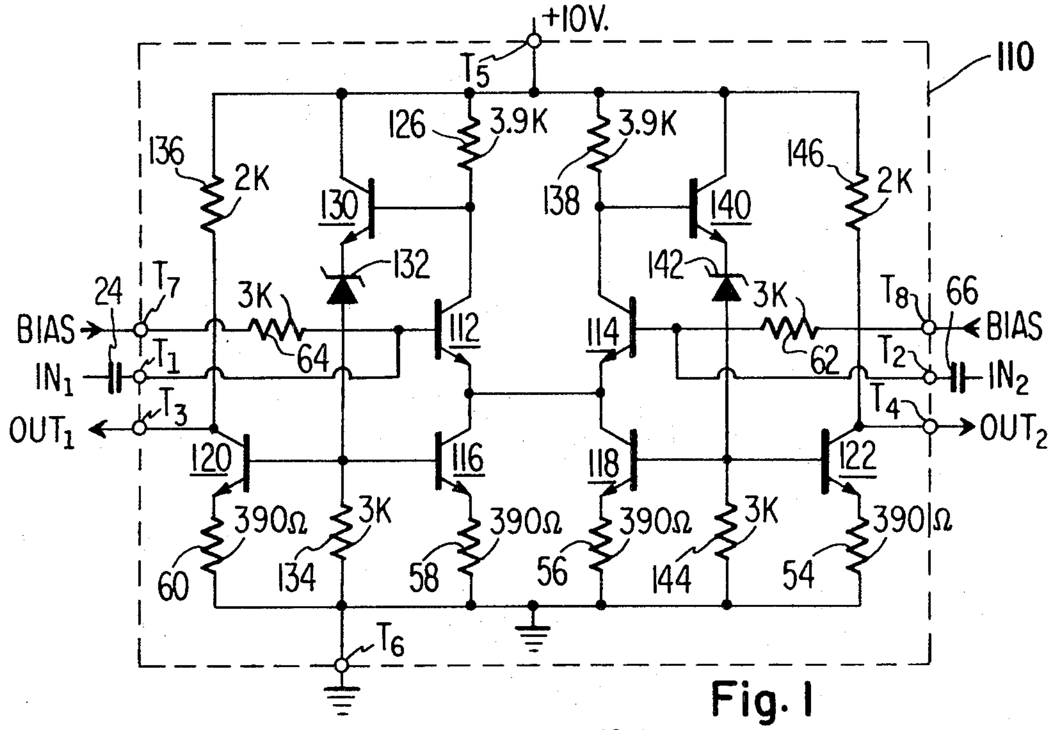

INVENTOR.
Steven A. Steckler
BY
Kenneth R. Schaefer
ATTORNEY

HIGH-GAIN DIFFERENTIAL AMPLIFIER

This invention relates to differential amplifier arrangements and, in particular, to differential amplifiers adapted to provide the combined characteristics of relatively high input impedance, high voltage gain and an output signal voltage range approximately equal to the available direct supply voltage associated with the amplifier.

While the invention is suitable for implementation using various forms of electronic devices, it is particularly adapted for fabrication using monolithic integrated circuit techniques. As used herein, the term monolithic integrated circuit refers to a solid state structure wherein a plurality of active semiconductor devices such as transistors and diodes, and passive circuit components such as capacitors and resistors, are constructed of common materials and interconnected by a sequence of processing steps on a common substrate of semiconductor material.

In the design of electronic amplifier circuits, and particularly where such circuits are constructed in monolithic integrated form, it is advantageous to utilize differential amplifier arrangements. Differential amplifiers provide a large number of advantages including the use of a minimum number of capacitors, the avoidance of use of large value resistors, dependence of gain on resistor ratios rather than absolute values, wide frequency operating range, stability, push-pull or single-ended inputs and/or outputs and a wide range of functions which are facilitated by the plurality of input and output terminals of such an amplifier.

One widely used differential amplifier arrangement employs a pair of amplifier transistors having their emitters coupled to a common constant current source transistor. One or more inputs are supplied to the bases of the amplifier transistors and outputs may be derived across load impedances coupled to the collectors of the amplifier transistors. Signals may also be applied to the base of the current source transistor to provide such functions as automatic gain control, stabilization, mixing or demodulation. While such an arrangement is versatile and, in general, provides good performance, the available output signal voltage variations which may be developed across the collector load impedances are limited to a value substantially less than the total collector direct supply voltage. Typically, the available output signal voltage range is of the order of one-half the collector supply voltage. This undesirable limitation, which is also encountered in other differential amplifier arrangements utilizing transistors coupled in series across the direct voltage supply (i.e., stacked transistors), results from the fact that the amplifier transistors are biased approximately at a voltage midway between the voltages provided at the direct voltage supply terminals associated with the differential configuration.

A type of single-ended amplifier employing stacked transistors but having the capability of providing output voltage variations comparable to the supply voltage is described in my U.S. Pat. application Ser. No. 862,759 entitled "Signal Translating Stage" and assigned to the same assignee as the present invention.

In accordance with one aspect of the present invention, a differential amplifier arrangement is provided wherein a relatively high voltage gain is realized and the available output signal voltage range is comparable to the direct voltage difference between supply terminals associated with the amplifier.

In the design of differential amplifiers, it is also desirable to provide an arrangement which is capable of linear reproduction of input signals which vary over a relatively wide range. In the widely used differential amplifier described previously, the output current (and therefore the output voltage across a resistive load) varies as an exponential function of the input difference voltage. The linear range of the transfer characteristic of such an amplifier is therefore limited to very low input voltages.

In accordance with a further aspect of the present invention, a differential amplifier arrangement is provided wherein a relatively high voltage gain is provided while preserving a linear relationship between input and output signals for a relatively wide range of input signals, the input signal level and voltage gain being sufficient to produce output signals up to a voltage comparable to the direct voltage difference between supply terminals associated with the amplifier.

A differential amplifier circuit constructed in accordance with the present invention comprises first and second input transistors, first and second regulator transistors and at least a first output transistor. Each input transistor is arranged substantially as an emitter follower wherein the emitter is direct coupled to the parallel combination of a load impedance and the main current path of an associated regulator transistor. The emitters of the input transistors are direct coupled to each other while the collectors are coupled to voltage supply means via separate feedback resistors. Direct current negative feedback is provided from the collector of each input transistor to the base of its associated regulator transistor so as to maintain substantially constant current in the input transistors. Input signals are applied to either or both of the input transistors and output signals may be derived across an impedance coupled to the output transistor. The base-emitter circuit of the output transistor is coupled in parallel with the base-emitter circuit of a corresponding one of the regulator transistors.

In a preferred embodiment of the invention, a resistance is direct coupled between the emitters of the input transistors. Furthermore, an output transistor is associated with each regulator transistor.

Figure 2:
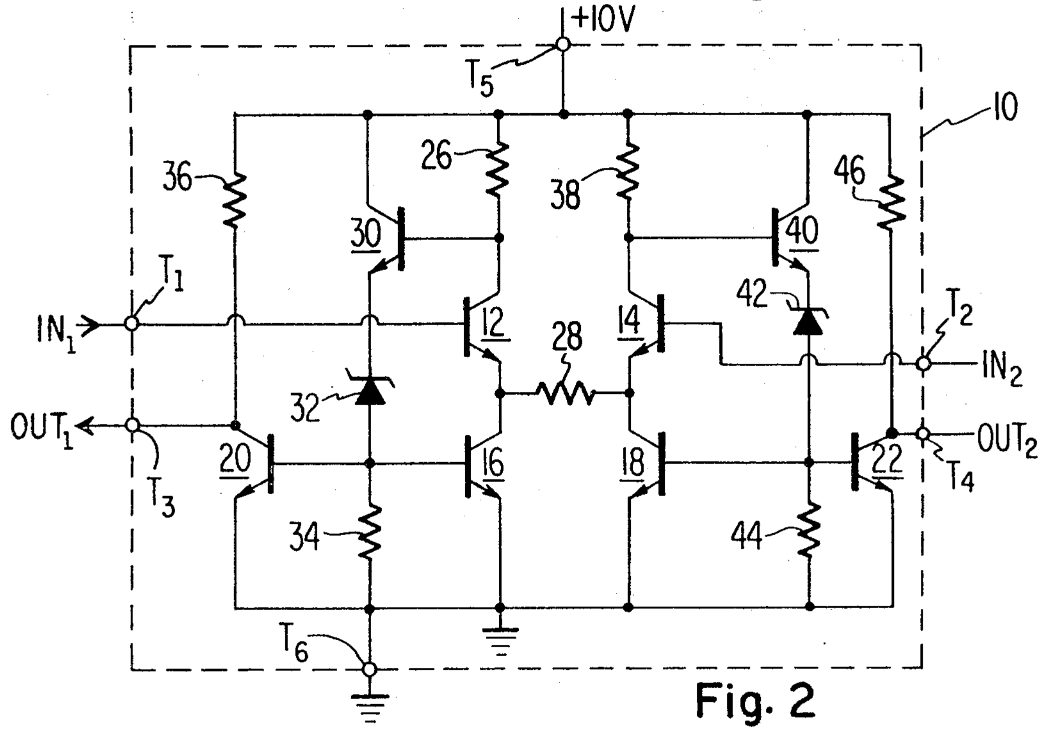

The novel features that are considered characteristic of this invention are set forth with particularity in the appended claims. The invention itself, however, both as to its organization and method of operation, as well as additional objects and advantages, will best be understood from the following description when read in connection with the accompanying drawing in which:

FIG. 1 is a schematic circuit diagram of a differential amplifier adapted for construction in integrated circuit form embodying the present invention, and FIG. 2 is a schematic circuit diagram of a modified differential amplifier adapted for construction in integrated circuit form embodying the present invention.

Referring to FIG. 2, a differential amplifier capable of providing balanced, push-pull output signals which are linearly related to one or more input signals is shown. The illustrated differential amplifier is particularly adapted for construction on an integrated circuit chip 10 indicated by the dashed outline. Input terminals $T_1$ and $T_2$ are provided on chip 10 and are adapted for connection to push-pull signal sources. Output terminals $T_3$ and $T_4$ are also provided on chip 10 and are adapted for coupling linearly amplified replicas of the push-pull input signals to appropriate utilization means (not shown). In addition, main (B+) supply terminals $T_5$ and $T_6$, adapted for connection to, for example, plus 10 volts and a reference (ground) potential, are provided on chip 10.

Each half of the differential amplifier configuration may be characterized as comprising an emitter follower transistor 12, 14, a shunt regulator transistor 16, 18 and an output transistor 20, 22. Referring to transistors 12, 16 and 20, input signals and bias are coupled via terminal $T_1$ to the base electrode of emitter follower transistor 12. The direct voltage supply (+10V) is coupled via terminal $T_5$ and a feedback resistor 26 to the collector electrode of follower transistor 12. The emitter electrode of follower transistor 12 is direct coupled to an emitter load comprising the parallel combination of the main conduction (collector-emitter) path of regulator transistor 16 and a load resistor 28 which is returned to ground via the collector-emitter path of regulator transistor 18.

The emitter of regulator transistor 16 is coupled directly to ground. An emitter degeneration resistor (not shown) may be provided if desired. Direct coupled negative feedback is provided from the collector electrode of follower transistor 12 to the base electrode of regulator transistor 16 by means of direct voltage translation network comprising a feedback transistor 30, a zener diode 32 and a resistor 34. Resistor 34 is coupled between the base of regulator transistor 16 and ground. The collector electrode of feedback transistor 30 is coupled to the B+supply terminal $T_5$. The base electrode of transistor 30 is connected to the collector electrode of follower transistor 12 while the emitter electrode of transistor 30 is coupled via direct voltage translating zener diode 32 to the base electrode of regulator transistor 16. Output signals are developed across an output load resistor 36 coupled between the B+supply terminal $T_5$ and the collector electrode of output transistor 20. The input (base-emitter) circuit of output transistor 20 is connected in parallel with the base-emitter circuit of regulator transistor 16 and is similar to that of transistor 16 (i.e., if an emitter degeneration resistor is coupled to transistor 16, transistor 20 also would include an emitter degeneration resistor proportionally related to the resistor of transistor 16). Transistors 16 and 20 are constructed so as to provide equal output current densities for equal input signals. Such a relationship is particularly realizable where transistors 16 and 20 are fabricated simultaneously in close proximity on a single integrated circuit chip. In that case, the output current densities produced by transistors 16 and 20 for a given input signal are related in the same proportion as the relative base-emitter areas of transistors 16 and 20. For equal areas, the currents of transistors 16 and 20 will be equal.

The second half of the differential amplifier is substantially identical to the first half described above. A feedback resistor 38 is coupled between B+ terminal $T_5$ and the collector of transistor 14. A feedback transistor 40, a voltage translating zener diode 42 and a base resistor 44 are coupled between the collector of follower transistor 14 and the base of regulator transistor 18. The input of output transistor 22 is coupled in parallel with the input of regulator transistor 18. A collector output load resistor 46 is associated with output transistor 22. Bias voltage and input signals 180° out of phase with respect to those supplied to terminal $T_1$ are coupled via terminal $T_2$ to the base of follower transistor 14. Transistors 22 and 18 are related in the same manner as transistors 20 and 16. The emitter electrode of follower transistor 14 is direct coupled to the end of resistor 28 remote from the emitter of transistor 12.

The biasing voltage supplied to terminals $T_1$ and $T_2$ may, for example, be provided from a preceding amplifier or from a separate bias supply and typically would be of the order of +5 volts for the illustrated configuration.

The above-described differential amplifier operates in the following manner. Under no signal conditions, equal bias voltages are provided to the base electrodes of input transistors 12 and 14. Substantially equal quiescent collector currents are produced in transistors 12 and 14 determined by the circuit parameters. The respective collector currents also flow in the collector-emitter circuits of the associated regulator transistors 16 and 18 such that substantially no quiescent current flows between the two halves of the amplifier through resistor 28.

Push-pull input signals which are to be amplified are applied via terminals $T_1$ and $T_2$. Considering the half of the amplifier comprising transistors 12, 16, 20 and 30, positive- and negative-going input signals tend to increase and decrease conduction of input transistor 12. Changes in the collector current of transistor 12 are sensed by means of feedback resistor 26 and corresponding decreases and increases of collector voltage of transistor 12 appear at the base electrode of feedback transistor 30. A voltage translation to a lower level is accomplished by means of the base-emitter junction of transistor 30 (e.g., 0.7 volt drop) and zener diode 32 (e.g., 5.6 volt drop). The feedback arrangement causes conduction of regulator transistor 16 to decrease and increase, respectively, while the current in resistor 28 varies in an opposite sense. The total current supplied by input transistor 12 is therefore maintained substantially constant. Furthermore, the voltage of the emitter of transistor 12 substantially follows the input voltage variations at the base of transistor 12. The input circuit of output transistor 20 is connected in parallel with that of transistor 16 such that variations in collector current in transistor 16 are directly reflected in the collector current of transistor 20. Output voltage variations which are linearly related to input voltage variations supplied to terminal $T_1$ are produced across load resistor 36.

At the same time, a portion of the input voltage variations which appear at the emitter of input transistor 12 is also coupled to the emitter of input transistor 14. The collector current of transistor 14 therefore tends to vary in an opposite sense from the collector current of transistor 12. The feedback arrangement comprising resistor 38, transistor 40, zener diode 42 and resistor 44 serves to cause the collector current of regulator transistor 18 to vary so as to maintain the collector current of input transistor 14 substantially constant. Output voltage variations of opposite phase with respect to those produced across resistor 36 are produced across the load resistor 46 as the collector current of output transistor 22 follows the variations in the collector current of regulator transistor 18.

In the above-described operation of the circuit, the current in the resistor 28 is proportional to the voltage difference between the bases of input transistors 12 and 14. Signal induced changes in the currents of transistors 16 and 20 are equal while corresponding changes in the currents of transistors 18 and 22 are equal but opposite to the first-mentioned current changes. Thus, where the two halves of the differential amplifier arrangement are substantially the same and transistors 12, 14, 16, 18, 20, 22 are substantially the same (as is readily realized with integrated circuit techniques), input signals supplied to terminal $T_1$ are linearly amplified and produced in opposite phases (i.e., push-pull relation) at the output terminals $T_3$ $T_4$.

In a similar manner, input signals supplied to terminal $T_2$ are reproduced in amplified push-pull fashion at terminals $T_3$ and $T_4$. Output signals appearing at terminal $T_3$ are in phase with inputs supplied to terminal $T_1$ and 180° out of phase with inputs supplied to terminal $T_2$. Output signals appearing at terminal $T_4$ are in phase with outputs supplied to terminal $T_2$ and 180° out of phase with inputs supplied to terminal $T_1$. It is possible in different applications of the invention, to eliminate one or the other of the input terminals and/or one or the other of the output terminals. Furthermore, where one output only is desired, one output transistor (e.g., transistor 22) and output load resistor (e.g., 46) may be eliminated.

It may also be desirable in certain applications to replace the load resistors by further transistors coupled in cascade relation to the output transistors.

The above-described differential amplifier arrangement provides a voltage gain determined substantially by the ratio between the resistance of an output load resistor (e.g., resistor 36) and the resistance of the resistor 28. Since resistance ratios may be controlled quite accurately on integrated circuits (e.g., ±1 percent) the gain of the amplifier is readily controlled and is also quite stable. The above-described configuration also provides (as noted above) linear reproduction of input signals over substantially the entire range from saturation to cutoff of regulator transistors 16 and 18. This linearity characteristic may be demonstrated by the following explanation.

The feedback arrangements associated with input transistors 12 and 14 tend to maintain collector current of those transistors substantially constant. There is, therefore substantially no variation of the base-emitter voltages of transistors 12 and 14. Since the voltages at the emitters of transistors 12 and 14 follow the voltages at their respective bases without $V_{BE}$ modulation as signal varies, the voltage across resistor 28 also follows the signal without $V_{BE}$ variation. The current variation in resistor 28 (a linear device) which results from a given input signal variation is reflected in equal current changes in regulator transistors 16 and 18 (the currents in transistors 16 and 18 vary oppositely for a given input signal). The output currents produced by transistors 20 and 22 are linearly proportional to (or in the case explained above, equal to) the currents in transistors 16 and 18. Output load resistors 36 and 46 are also linear devices. Therefore, the output voltage variations across resistors 36 and 46 are linearly related to input voltage variations.

Transistors 16, 18, 20, 22 may be driven from saturation to cutoff without disturbing the linear relationship set forth above. Therefore, the output voltages produced at terminals $T_3$ and $T_4$ may vary from B+(10 volts in the illustrated case) to the saturation voltage of transistors 20, 22 (i.e., of the order of 0.1 volts), or a range substantially equal to the entire supply voltage associated with the amplifier.

It should also be noted that since the collector currents of input transistors 12 and 14 are maintained substantially constant, the input impedance of the amplifier is relatively high (i.e., at terminals $T_1$ and $T_2$).

Referring to FIG. 1 of the drawing, an alternate embodiment of the invention is shown wherein circuit elements similar to those of FIG. 2 are indicated by similar reference numerals preceded by a one.

In the embodiment shown in FIG. 1, equal emitter degeneration resistors 54, 56, 58 and 60 are associated with each of transistors 122, 118, 116 and 120, respectively. Bias coupling resistors 62 and 64 are associated with input transistors 114 and 112. Bias voltages may be supplied from means external to integrated circuit chip 110 via terminals $T_7$ and $T_8$. A suitable bias supply arranged to provide a direct voltage of 5 volts (i.e., one-half the B+voltage) may be provided by a circuit of the type described in U.S. Pat. No. 3,383,612, entitled "Integrated Circuit Biasing Arrangements," granted May 14, 1968 to L. A. Harwood and assigned to the same assignee as the present invention. Input signals are supplied via capacitors 24 and 66 and terminals $T_1$ and $T_2$ to the bases of transistors 112 and 114, respectively.

In FIG. 1, the emitters of input transistors 112 and 114 are coupled directly together. While the permissible input signal voltage range for linear operation of such a configuration is lower than where a resistor is coupled between the emitters of the input transistors, the available voltage gain is higher in the case of the FIG. 1 arrangement. Specifically, in the illustrated case, the signal voltage gain is equal substantially to the ratio of the resistance of one of load resistors 136 and 138 to twice the impedance looking into the junction between the emitter of transistor 112 and the collector of transistor 116 (or 114 and 118 which is the same). A circuit constructed utilizing the circuit values shown in FIG. 1 and transistors having a current gain ($\beta$) of the order of 30 and 50 provided a voltage gain of 300 with a maximum input signal voltage of 50 millivolts peak to peak.

Additional modifications may also be made to the circuit. For example, the feedback circuits may employ other direct voltage translating or blocking schemes. The transistors 130 and 140 may be omitted if desired. Furthermore, additional voltage gain may be provided by placing additional transistors in the output circuits with their electrodes coupled to corresponding electrodes of transistors 120 and 122 (i.e., parallel output transistors may be provided).

What is claimed is:

1. An electronic signal amplifier comprising:
first and second input transistors,
first and second regulating transistors,
output means comprising at least one output transistor,
each of said transistors having base, emitter and collector electrodes,
low impedance means for directly connecting a collector-emitter conduction path of each of said input transistors in series relation with a collector-emitter conduction path of a corresponding one of said regulating transistors,
means for coupling input signals to the base of at least one of said input transistors,
means for direct current coupling a point intermediate the emitter of said first input transistor and the collector of said first regulating transistor to a point intermediate the emitter of said second input transistor and the collector of said second regulating transistors,
feedback means coupled from each of said input transistors to a corresponding one of said regulating transistors for varying current in said regulating transistor collector-emitter paths in response to input signals while tending to reduce variations, from a quiescent value, of current in said collector-emitter paths of said input transistors,
means for coupling the base-emitter circuit of said output transistors in parallel with the base emitter circuit of one of said regulating transistors such that the same signal is supplied to said parallel-coupled base-emitter circuits of said output and regulating transistors, and
means coupling a load impedance to the collector-emitter path of said output transistor for producing a substantially linearly amplified replica of said input signals, the voltage gain of said amplifier being determined by the ratio of said load impedance to the impedance at said point associated with the collector of said one regulating transistor.

2. An amplifier according to claim 1 wherein:
said means for reducing current variations in each said input transistor comprises negative feedback means for maintaining collector current of each said input transistor substantially constant as input signals are supplied.

3. An amplifier according to claim 2 wherein:
each said negative feedback means comprises a resistive load coupled to the collector of one of said input transistors and voltage translating means coupled between said collector and the base of the corresponding regulating transistor.

4. An amplifier according to claim 3 wherein:
said output means further comprises an output load impedance coupled to the collector of said output transistor, and
all of said input, regulating and output transistors are of like type conductivity.

5. An amplifier according to claim 4 wherein:
said output means further comprises a second output transistor and a corresponding output load impedance coupled to the other of said regulating transistors for providing push-pull output signals.

6. An amplifier according to claim 3 wherein:
said means for direct current coupling said points intermediate said input and regulating transistors comprises a resistor.

7. An amplifier according to claim 6 wherein:
said regulating and output transistors have proportionally related conduction characteristics.

8. An amplifier according to claim 7 wherein:
said regulating and output transistors are substantially identical and are in close thermal relation.

9. An amplifier according to claim 8 wherein:
all said elements are constructed in monolithic integrated form on a single substrate.

10. An amplifier according to claim 8 wherein:
the emitters of said regulating and output transistors are direct coupled to a point of reference potential.

11. A differential electronic signal amplifier comprising:
a pair of terminals adapted for connection to a source of operating voltage,
first and second input transistors,
first and second regulating transistors,
output means comprising at least one output transistors,
means for direct current coupling the collector-emitter path of each of said input transistors and the collector-emitter path of a corresponding one of said regulating transistors in series relation between said terminals,
means for supplying input signals to the base electrode of at least one of said first and second input transistors,
resistive means direct current coupled between the emitters of said input transistors, separate negative feedback means coupled from the collector of each of said input transistors to the base of a corresponding one of said regulating transistors for maintaining collector current of said input transistors substantially constant while causing collector current in said regulating transistors to vary in push-pull relation in response to input signals, means for directly coupling the base-emitter circuit of said output transistor in parallel with the base-emitter circuit of one of said regulating transistors such that the same signal is supplied to said parallel-coupled base-emitter circuits of said output and regulating transistors, and means coupling a load impedance to the collector-emitter path of said output transistor for producing a substantially linearly amplified replica of said input signals, the voltage gain of said amplifier being determined by the ratio of said load impedance to the impedance at the collector of said one of said regulating transistors.

12. A differential amplifier according to claim 11 wherein:

the emitters of said input transistors and the collectors of corresponding regulating transistors are joined at opposite ends of said resistive means.

313. A differential amplifier according to claim 12 wherein:

said regulating and output transistors have proportionally related conduction characteristics.

14. A differential amplifier according to claim 13 wherein:

the emitters of said regulating and output transistors are direct coupled to one of said output terminals which is at a reference voltage level such that output signals are developed acrss said output load impedance with respect to said reference voltage level.

15. A differential amplifier according to claim 14 wherein:

said means for direct current coupling said transistors between said terminals comprises separate feedback resistors connected between the other of said terminals and the collectors of said input transistors.

* * * * *

UNITED STATES PATENT OFFICE
CERTIFICATE OF CORRECTION

Patent No. 3,622,903 Dated November 23, 1971

Inventor(x) Steven Alan Steckler

It is certified that error appears in the above-identified patent and that said Letters Patent are hereby corrected as shown below:

Column 4, line 40, that portion reading "outputs" should read -- inputs --; line 48, that portion reading "cascade" should read -- cascode --. Column 5, line 48, that portion reading "30 and 50" should read -- 30 to 50 --. Column 6, line 2, that portion reading "transistors" should read -- transistor --; line 10, that portion reading "transistors" should read -- transistor --. Column 8, line 4, that portion reading "313" should read -- 13 --.

Signed and sealed this 18th day of July 1972.

(SEAL)
Attest:

EDWARD M.FLETCHER,JR.
Attesting Officer

ROBERT GOTTSCHALK
Commissioner of Patents